(12) United States Patent
Parkhe

(10) Patent No.: US 12,347,659 B2
(45) Date of Patent: *Jul. 1, 2025

(54) ELECTROSTATIC CHUCK ASSEMBLY FOR CRYOGENIC APPLICATIONS

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/735,379

(22) Filed: Jun. 6, 2024

(65) Prior Publication Data

US 2024/0331987 A1    Oct. 3, 2024

Related U.S. Application Data

(63) Continuation of application No. 18/237,673, filed on Aug. 24, 2023, now Pat. No. 12,033,837, which is a
(Continued)

(51) Int. Cl.
*H01J 37/32* (2006.01)
*H01L 21/683* (2006.01)
*H01L 21/67* (2006.01)

(52) U.S. Cl.
CPC .... *H01J 37/32724* (2013.01); *H01L 21/6833* (2013.01); *H01J 2237/2007* (2013.01); *H01J 2237/334* (2013.01); *H01L 21/67069* (2013.01)

(58) Field of Classification Search
CPC ........ H01L 21/67069; H01L 21/67109; H01L 21/6833; H01L 21/68757; H01J 37/32724; H01J 2237/2007; H01J 2237/334
(Continued)

(56) References Cited

U.S. PATENT DOCUMENTS 3,898,369 A    8/1975  Clabburn
5,796,074 A    8/1998  Edelstein et al.
(Continued)

FOREIGN PATENT DOCUMENTS

CN    104254913 A    12/2014
CN    104285290 A    1/2015
(Continued)

OTHER PUBLICATIONS

Machine translation of Yokoyama Japanese Patent Document JP 2002-164425 A Jun. 2002 (Year: 2002).*
(Continued)

*Primary Examiner* — Kevin J Comber
(74) *Attorney, Agent, or Firm* — Patterson + Sheridan, LLP

(57) ABSTRACT

Embodiments of the present disclosure generally relate to an electrostatic chuck assembly suitable for use in cryogenic applications. In one or more embodiments, an electrostatic chuck assembly is provided and includes an electrostatic chuck having a substrate supporting surface opposite a bottom surface, a cooling plate having a top surface, where the cooling plate contains an aluminum alloy having a coefficient of thermal expansion (CTE) of less than 22 ppm/° C., and a bonding layer securing the bottom surface of the electrostatic chuck and the top surface of the cooling plate.

23 Claims, 3 Drawing Sheets

Related U.S. Application Data continuation of application No. 17/317,816, filed on May 11, 2021, now Pat. No. 11,776,794.

(60) Provisional application No. 63/151,294, filed on Feb. 19, 2021.

(58) Field of Classification Search
USPC .......................................................... 361/234
See application file for complete search history.

(56) References Cited

U.S. PATENT DOCUMENTS

| | | | |
|---|---|---|---|
| 6,083,363 | A | 7/2000 | Ashtiani et al. |
| 7,465,478 | B2 | 12/2008 | Collins et al. |
| 9,349,605 | B1 | 5/2016 | Xu et al. |
| 2006/0266288 | A1 | 11/2006 | Choi |
| 2007/0264443 | A1 | 11/2007 | Choi et al. |
| 2013/0027838 | A1 | 1/2013 | Hori et al. |
| 2013/0082197 | A1 | 4/2013 | Yang et al. |
| 2014/0069584 | A1 | 3/2014 | Yang et al. |
| 2014/0227881 | A1 | 8/2014 | Lubomirsky et al. |
| 2015/0036261 | A1* | 2/2015 | Jindo ............... C04B 35/62635 165/185 |
| 2016/0276196 | A1 | 9/2016 | Parkhe |
| 2018/0010242 | A1 | 1/2018 | Rasheed et al. |
| 2020/0035535 | A1* | 1/2020 | Parkhe .............. H01L 21/67103 |
| 2020/0185248 | A1 | 6/2020 | Sarode Vishwanath et al. |
| 2021/0082730 | A1 | 3/2021 | Sarode Vishwanath et al. |
| 2022/0270864 | A1 | 8/2022 | Parkhe |
| 2023/0402267 | A1 | 12/2023 | Parkhe |

FOREIGN PATENT DOCUMENTS

| | | | |
|---|---|---|---|
| JP | 2001288526 | A | 10/2001 |
| JP | 2001313331 | A | 11/2001 |
| JP | 2002164425 | A * | 6/2002 |
| JP | 2004079861 | A | 3/2004 |
| JP | 2005150370 | A | 6/2005 |
| JP | 2006144118 | A | 6/2006 |
| JP | 2008071845 | A | 3/2008 |
| JP | 2008159831 | A | 7/2008 |
| JP | 2011222977 | A | 11/2011 |
| JP | 5218865 | B2 | 6/2013 |
| JP | 2018006393 | A | 1/2018 |
| JP | 2018510496 | A | 4/2018 |
| JP | 2018206806 | A | 12/2018 |
| JP | 2019087637 | A | 6/2019 |
| JP | 2020023088 | A | 2/2020 |
| JP | 2020045456 | A | 3/2020 |
| KR | 20200115310 | A | 10/2020 |
| TW | I838671 | B | 4/2024 |
| WO | 2014182711 | A1 | 11/2014 |
| WO | 2016094494 | A2 | 6/2016 |
| WO | 2020185467 | A1 | 9/2020 |

OTHER PUBLICATIONS

Zheng et al. "Thermal expansion and mechanical properties of Al/Si composites fabricated by pressure infiltration" Sep. 2007 (Year: 2007).*
Habazaki et al. "Novel Al—Mo and Al—Mo—Si Alloys Resistant to Sulfidizing and Oxidizing Environments" 1995 (Year: 1995).*
Korean Office Action dated Jun. 13, 2024 for Application No. 10-2023-7002037.
Taiwan Office Action dated Aug. 28, 2024 for Application No. 113109101.
International Search Report and Written Opinion dated Jun. 7, 2022 for Application No. PCT/US2021/063908.
Zheng et al. "Thermal exapnsion and mechanical properties of Al/Si composites fabricated by pressure infiltration" Trans. Non-ferrous Met. Soc. China 17 Science Press, 2007, S326-S329.
Habazaki et al. "Novel Al-Mo and Al-Mo-Si Alloys Resistant to Sulfidizing and Oxidizing Environment" Zairyo-to-Kankyo 44 Comprehensive Paper 1995, 174-182.
Taiwan Office Action dated May 17, 2023 for Application No. 110147873.
Japanese Notice of Observation dated Dec. 19, 2023 for Application No. 2023-505365.
Korean Notice of Third Party Observation dated Jan. 8, 2024 for Appication No. 10-2023-7002037.
Japanese Office Action dated May 14, 2024 for Application No. 2023-505365.
"What is A6061? (Strength/Specific Gravity/Young's Modulus/ Hardness) Mechanical Characteristics and Corrosion Resistance", Mechanical Technology Notes, May 12, 2020, tec-note.com/847.
"What is A4032? (Strength/Specific Gravity/Young's Modulus/ Hardness) Mechanical Characteristics and Corrosion Resistance", Mechanical Technology Notes, May 12, 2020, tec-note.com/1035.
Taiwan Office Action dated Apr. 8, 2025 for Application No. 113109101.

* cited by examiner

ELECTROSTATIC CHUCK ASSEMBLY FOR CRYOGENIC APPLICATIONS

CROSS-REFERENCE TO RELATED APPLICATIONS

This application is a continuation of U.S. application Ser. No. 18/237,673, filed Aug. 24, 2023, which is a continuation of U.S. application Ser. No. 17/317,816, filed May 11, 2021, and issued as U.S. Pat. No. 11,776,794, which claims benefit of U.S. Prov. Appl. No. 63/151,294, filed Feb. 19, 2021, which are herein incorporated by reference in their entirety.

BACKGROUND

Field

Embodiments of the present disclosure generally relate to apparatus and processes for microelectronic manufacturing, and more specifically, to a substrate support assembly having an electrostatic chuck assembly used in cryogenic applications.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at temperatures above 300° C. and high bias power while processing films on a substrate. The high bias power improves the film roughness and morphology on the substrate. However, the high bias power also provides heat energy when the power is on.

Some of these high temperature and high power fabrication techniques are performed in processing chambers that utilize electrostatic chucks to secure a substrate being processed within the chamber. Conventional electrostatic chucks are part of a substrate support assembly that includes a cooling plate. The cooling plate is bonded to the electrostatic chuck. The material utilized for the bond between the cooling plate and electrostatic chuck is sensitive to high temperature, thermal expansion, and high energy fields. The conventional electrostatic chucks may experience problems with the bonding material due to a combination of the aforementioned factors. For example, the bond material may delaminate and fail altogether, causing a loss of vacuum or movement in the substrate support. The processing chamber must be taken off-line in order to replace electrostatic chucks having problems with the bonding material, thus undesirably increasing costs, while reducing processing yield.

In cryogenic applications, the cooling plate is exposed to a cryogenic fluid to remove heat from the substrate. The cooling plate can be cooled to temperatures of less than 0° C., such as from about −10° C. to about −100° C. or lower. At such low temperatures, the electrostatic chuck and the cooling plate often separate due to delamination of the bonding between the interface of these bodies. The delamination is brought on by thermal stresses in these bodies caused by the differences in thermal expansion coefficients of the various materials in the bodies. Standard adhesives typically cannot maintain a bond at temperatures of sub-zero temperatures.

Thus, there is a need for an improved substrate support assembly suitable for use in cryogenic applications.

SUMMARY

Embodiments of the present disclosure generally relate to an electrostatic chuck (ESC) assembly suitable for use in cryogenic applications. The design of ESC assembly utilizes management of stress produced by various factors. Cooling the ESC assembly to temperatures used in cryogenic applications causes thermal expansion coefficient changes as a function of temperature. The ESC assemblies described and discussed herein can handle the temperatures used in cryogenic applications without cracking or delamination due to the particular materials having similar CTE values used within the components of ESC assemblies.

In one or more embodiments, an electrostatic chuck assembly is provided and includes an electrostatic chuck having a substrate supporting surface opposite a bottom surface, a cooling plate having a top surface, where the cooling plate contains an aluminum alloy having a CTE of less than 22 ppm/° C., and a bonding layer securing the bottom surface of the electrostatic chuck and the top surface of the cooling plate, where the bonding layer contains a silicone material.

In some embodiments, an electrostatic chuck assembly is provided and includes an electrostatic chuck having a substrate supporting surface opposite a bottom surface, a cooling plate containing an aluminum alloy which has aluminum and silicon and has a CTE of less than 22 ppm/° C., and a bonding layer containing a silicone material and disposed between the electrostatic chuck and the cooling plate.

In other embodiments, an electrostatic chuck assembly is provided and includes an electrostatic chuck having a substrate supporting surface opposite a bottom surface, a cooling plate containing an aluminum alloy which includes aluminum and silicon and has a CTE of less than 22 ppm/° C., and a bonding layer disposed between the electrostatic chuck and the cooling plate, where the bonding layer contains a silicone layer, an indium-containing layer, and a secondary metal layer disposed between the silicone material and the indium-containing layer, where the secondary metal layer contains molybdenum, tungsten, chromium, and alloys thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to an electrostatic chuck assembly suitable for use in cryogenic applications. In one or more embodiments, the electrostatic chuck assembly is used at cryogenic processing temperatures of less than 0° C., and less than −10° C., such as about −50° C., about −80° C., or about −100° C. to about −110° C., about −120° C., about −135° C., or about −150° C. For example, the electrostatic chuck assembly is used at a cryogenic processing temperature of about −50° C. to about −150° C.

Figure 1:
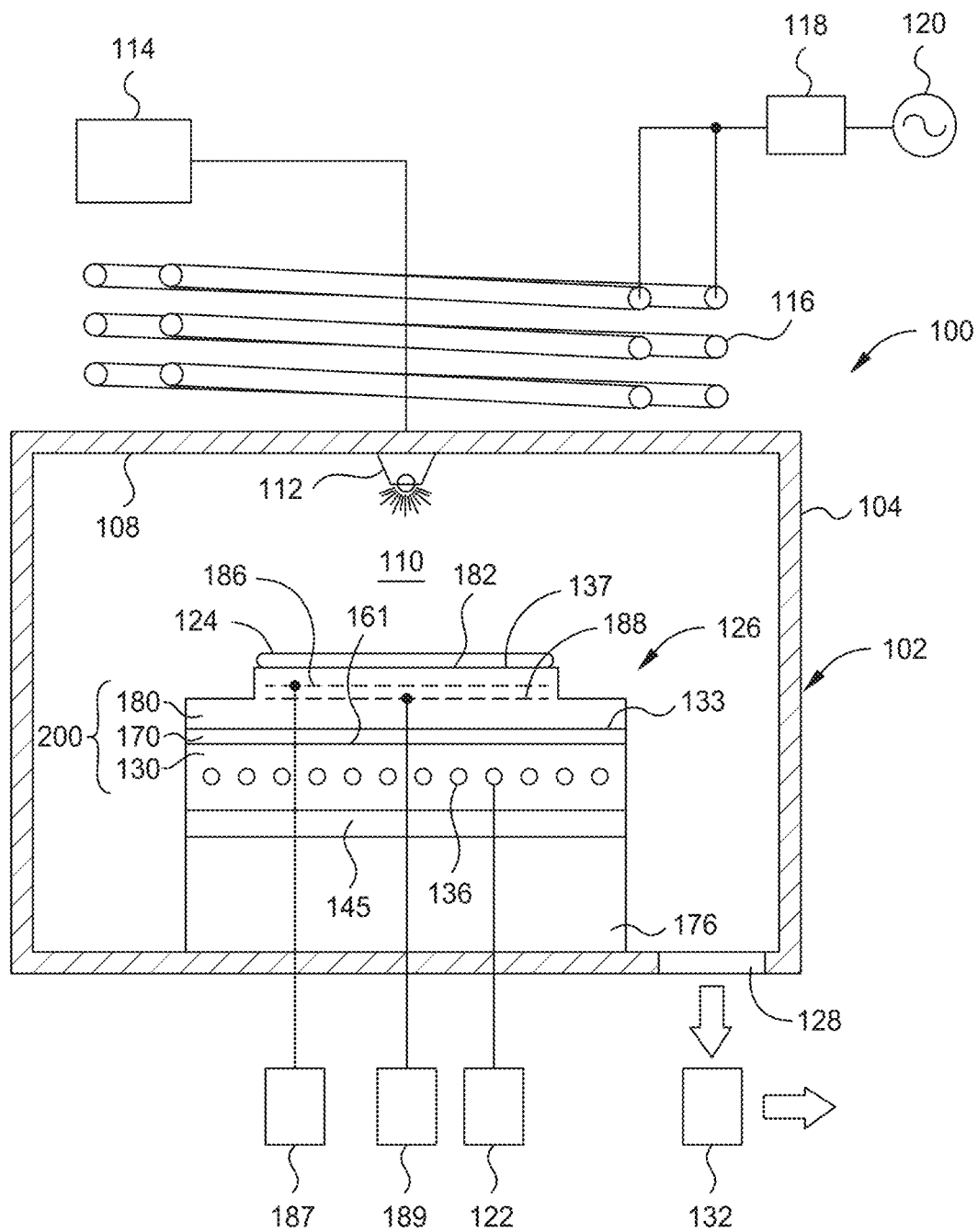
FIG. 1 depicts a cross-sectional schematic side view of a processing chamber containing a substrate support assembly having an electrostatic chuck assembly, according to one or more embodiments described and discussed herein.

FIG. 1 is a cross-sectional schematic view of an exemplary plasma processing chamber 100, shown configured as an etch chamber, having a substrate support assembly 126. The substrate support assembly 126 may be utilized in other types of processing plasma chambers, for example plasma treatment chambers, annealing chambers, physical vapor deposition (PVD) chambers, chemical vapor deposition (CVD) chambers, and ion implantation chambers, among others, as well as other systems where the ability to control processing uniformity for a surface or substrate, such as a substrate, is desirable. Control of the dielectric properties tan (δ), e.g., dielectric loss, or p, e.g., the volume resistivity at elevated temperature ranges for the substrate support assembly 126 beneficially enables azimuthal processing control, e.g., processing uniformity, for a substrate 124 disposed thereon the substrate support assembly 126.

The plasma processing chamber 100 includes a chamber body 102 having sidewalls 104, a bottom and a lid 108 that enclose an interior processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Processing gas, along with any processing by-products, are removed from the processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the processing region 110.

The processing gas may be energized to form a plasma within the processing region 110. The processing gas may be energized by capacitively or inductively coupling RF power to the processing gases. In the embodiment depicted in FIG. 1, a plurality of coils 116 are disposed above the lid 108 of the plasma processing chamber 100 and coupled through a matching circuit 118 to an RF power source 120.

The substrate support assembly 126 is disposed in the processing region 110 below the injection apparatus 112. The substrate support assembly 126 includes an electrostatic chuck (ESC) 174 and a cooling plate 130. The cooling plate 130 is supported by a base plate 176. The base plate 176 is supported by one of the sidewalls 104 or bottom 106 of the processing chamber. The substrate support assembly 126 may additionally include a heater assembly (not shown). Additionally, the substrate support assembly 126 may include a facility plate 145 and/or an insulator plate (not shown) disposed between the cooling plate 130 and the base plate 176 to facilitate electrical, cooling, and gas connections with the substrate support assembly 126.

The cooling plate 130 is formed from or otherwise contains one or more metal materials. In one or more examples, the cooling plate 130 contains one or more aluminum alloys, one or more aluminum-silicon alloys, one or more aluminum-molybdenum alloys, one or more aluminum-molybdenum-silicon alloys, and other alloys and/or composite materials as further described and discussed herein. The cooling plate 130 includes a plurality of cooling channels 138 formed therein. The cooling channels 138 are connected to a heat transfer fluid source 122. The heat transfer fluid source 122 provides a heat transfer fluid, such as a liquid, gas or combination thereof, which is circulated through one or more cooling channels 138 disposed in the cooling plate 130. The fluid flowing through neighboring cooling channels 138 may be isolated to enabling local control of the heat transfer between the ESC 180 and different regions of the cooling plate 130, which assists in controlling the lateral temperature profile of the substrate 124. In one or more embodiments, the heat transfer fluid circulating through the cooling channels 138 of the cooling plate 130 maintains the cooling plate 130 at a temperature of less than 0° C., such as about −40° C. to about −100° C.

The ESC 180 includes one or more chucking electrodes 186 disposed in a dielectric body 182. The dielectric body 182 of the ESC 180 has a substrate support surface 137 and a bottom surface 133 opposite the substrate support surface 137. The dielectric body 182 of the ESC 180 is fabricated from a ceramic material, such as alumina ($Al_2O_3$), aluminum nitride (AlN) or other suitable material. Alternately, the dielectric body 182 may be fabricated from a polymer, such as polyimide, polyetheretherketone, polyaryletherketone and the like.

The dielectric body 182 optionally includes one or more resistive heaters 188 embedded therein. The resistive heaters 188 are utilized to elevate the temperature of the substrate support assembly 126 to a temperature suitable for processing a substrate 124 disposed on the substrate support surface 137 of the substrate support assembly 126. The resistive heaters 188 are coupled through the facility plate 145 to a heater power source 189. The heater power source 189 may provide 900 watts or more power to the resistive heaters 188. A controller (not shown) is utilized control the operation of the heater power source 189, which is generally set to heat the substrate 124 to a predefined temperature. In one or more embodiments, the resistive heaters 188 include a plurality of laterally separated heating zones, wherein the controller enables at least one zone of the resistive heaters 188 to be preferentially heated relative to the resistive heaters 188 located in one or more of the other zones. For example, the resistive heaters 188 may be arranged concentrically in a plurality of separated heating zones. The resistive heaters 188 may maintain the substrate 124 at a temperature suitable for processing, such as between about 180° C. to about 500°

C., such as greater than about 250° C., such as between about 250° C. and about 300° C.

In one or more embodiments, the dielectric body 182 of the ESC 180 has a plurality of heaters producing a micro-zone effect. Here, micro zones refer to discretely temperature controllable areas of the ESC 180 where there may be 10, about 50, about 80, or about 100 micro zones to about 120, about 150, about 200, or more micro zones on the ESC 180. The high temperature is intended to refer to temperatures in excess of about 150° C., for example, temperatures greater than 300° C. The examples of the ESC assemblies described and discussed herein include the cooling plate and the electrostatic chuck separated by the bonding layer that has thermal interface properties. The arrangement of the thermal interface between the ESC 180, the bonding layer, and the cooling plate 130 reduces temperature drain and thermal smearing between the micro zones in the ESC 180.

The ESC 180 generally includes a chucking electrode 186 embedded in the dielectric body 182. The chucking electrode 186 may be configured as a mono polar or bipolar electrode, or other suitable arrangement. The chucking electrode 186 is coupled through an RF filter to a chucking power source 187, which provides a DC power to electrostatically secure the substrate 124 to the substrate support surface 137 of the ESC 180. The RF filter prevents RF power utilized to form a plasma (not shown) within the plasma processing chamber 100 from damaging electrical equipment or presenting an electrical hazard outside the chamber.

The substrate support surface 137 of the ESC 180 includes gas passages (not shown) for providing backside heat transfer gas to the interstitial space defined between the substrate 124 and the substrate support surface 137 of the ESC 180. The ESC 180 also includes lift pin holes for accommodating lift pins (not shown) for elevating the substrate 124 above the substrate support surface 137 of the ESC 180 to facilitate robotic transfer into and out of the plasma processing chamber 100.

A bonding layer 170 is disposed below the ESC 180 and secures the ESC 180 to the cooling plate 130. In other embodiments, the bonding layer 170 is disposed between the ESC 180 and a lower plate that is disposed between the ESC 180 and cooling plate 130, as will be described further below. The bonding layer 170 may have a thermal conductivity between about 0.1 W/mK and about 5 W/mk. The bonding layer 170 may be formed from several layers which compensate for different thermal expansion between the ESC 180 and underlying portions of the substrate support assembly 126, such as for example, the cooling plate 130. The layers containing the bonding layer 170 may be formed from different materials and is discussed in reference to subsequent figures illustrating separate embodiments.

In one or more embodiments, the ESC 180 contains a material having a coefficient of thermal expansion (CTE) of less than 15 parts per million/° C. (ppm/° C.), such as about 5 ppm/° C. to about 10 ppm/° C. For example, the ESC 180, such as the body 182, can contain alumina, aluminum nitride, or dopants thereof. In one or more examples, the ESC 180 contains about 50 heaters to about 200 heaters disposed therein. Each heater can be independently enabled to control temperature in a respective zone.

Figure 2:
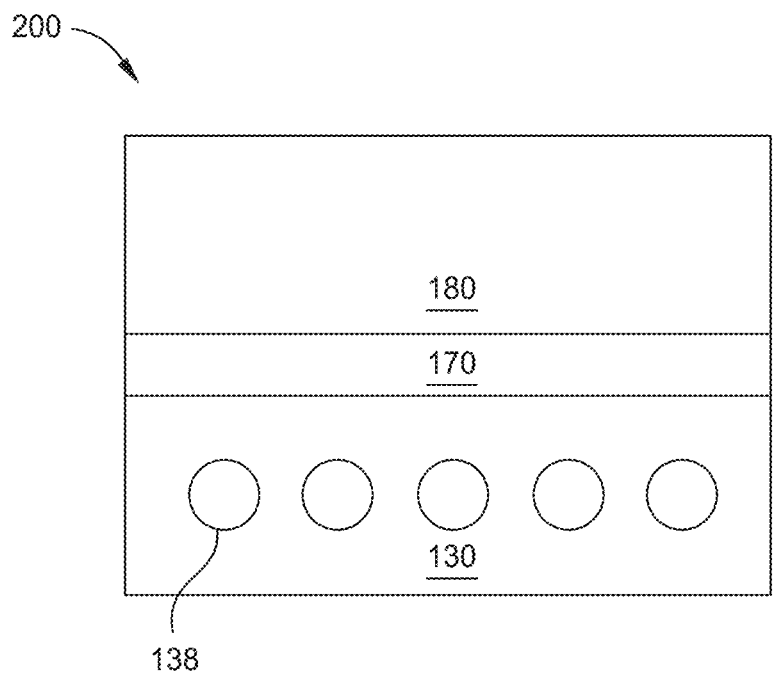
FIG. 2 depicts a cross-sectional schematic side view of an electrostatic chuck assembly, according to one or more embodiments described and discussed herein.

FIG. 2 depicts a cross-sectional schematic side view of an electrostatic chuck (ESC) assembly 200, according to one or more embodiments described and discussed herein. In one or more embodiments, the ESC assembly 200 includes an ESC 180 having a workpiece supporting surface opposite a bottom surface, a cooling plate 130 having a top surface and a bonding layer 170 securing the bottom surface of the ESC 180 and the top surface of the cooling plate 130. The bonding layer 170 contains or includes one or more silicone materials. The cooling plate 130 contains an aluminum alloy having a CTE of less than 24 ppm/° C., less than 22 ppm/° C., or less than 20 ppm/° C.

In one or more embodiments, the aluminum alloy contains aluminum, silicon, and one or more metals other than aluminum. For example, the other metal can be or include molybdenum, tungsten, chromium, iron, nickel, titanium, zirconium, iron-nickel-cobalt alloys, alloys thereof, and/or any combination thereof.

In some embodiments, the aluminum alloy contains about 25 atomic percent (at %), about 30 at %, about 40 at %, about 50 at %, or about 55 at % to about 60 at %, about 70 at %, about 80 at %, about 85 at %, about 90 at %, about 95 at %, or about 99 at % of aluminum. In some examples, the aluminum alloy contains about 80 at %, about 82 at %, about 85 at %, about 88 at %, or about 90 at % to about 92 at %, about 94 at %, about 95 at %, about 96 at %, about 97 at %, about 98 at %, or about 99 at % of aluminum.

The aluminum alloy can contain about 0.1 at %, about 0.2 at %, about 0.5 at %, about 1 at %, about 2 at %, about 3 at %, about 5 at %, about 6 at %, or about 8 at % to about 10 at %, about 12 at %, about 15 at %, about 20 at %, about 25 at %, about 30 at %, about 35 at %, or about 40 at % of silicon. The aluminum alloy can contain about 25 at %, about 30 at %, about 35 at %, or about 40 at % to about 45 at %, or about 50 at % of one or more other metals (e.g., molybdenum, tungsten, chromium, iron, nickel, titanium, zirconium).

In one or more examples, the aluminum alloy contains aluminum, silicon, and at least one metal selected from molybdenum, tungsten, chromium, or alloys thereof. For example, the aluminum alloy contains about 30 at % to about 60 at % of aluminum, about 30 at % to about 60 at % of molybdenum, and about 5 at % to about 30 at % of silicon. In other examples, the aluminum alloy (e.g., 4032 Al) contains about 80 at % to about 90 at % of aluminum and about 5 at % to about 20 at % of silicon. In further examples, the aluminum alloy (e.g., 6061 Al) contains at least 95 at % of aluminum, about 0.5 at % to about 2 at % magnesium, and about 0.2 at % to about 1.5 at % of silicon.

The aluminum alloy has a CTE of less than 24 ppm/° C., such as less than 22 ppm/° C., less than 20 ppm/° C., and/or less than 18 ppm/° C. In some embodiments, the aluminum alloy has a CTE of about 3 ppm/° C., about 4 ppm/° C., about 5 ppm/° C., about 6 ppm/° C., about 7 ppm/° C., about 8 ppm/° C., or about 9 ppm/° C. to about 10 ppm/° C., about 12 ppm/° C., about 14 ppm/° C., about 15 ppm/° C., about 16 ppm/° C., about 18 ppm/° C., about 19 ppm/° C., about 20 ppm/° C., about 21 ppm/° C., about 22 ppm/° C., about 23 ppm/° C., or about 24 ppm/° C. In one or more examples, the aluminum alloy has a CTE of about 4 ppm/° C. to about 16 ppm/° C. In other examples, the aluminum alloy has a CTE of about 5 ppm/° C. to about 15 ppm/° C. In some examples, the aluminum alloy has a CTE of about 7 ppm/° C. to about 12 ppm/° C.

The cooling plate 130 can have a thickness of about 0.1 inches, about 0.2 inches, about 0.25 inches, about 0.4 inches, or about 0.5 inches to about 0.6 inches, about 0.8 inches, about 1 inch, about 1.2 inches, about 1.5 inches, about 1.8 inches, about 2 inches, or greater. In one or more examples, the cooling plate 130 can have a thickness of about 0.1 inches to about 2 inches, such as about 0.5 inches to about 1.5 inches or about 0.25 inches to about 1 inch.

In one or more embodiments, the bonding layer 170 can be or contain one, two, or more types of silicone materials.

In some examples, the silicone material of the bonding layer 170 can be or include one or more alkyl phenyl silicones. Exemplary alkyl phenyl silicones can be or include methyl phenyl silicone, ethyl phenyl silicone, propyl phenyl silicone, butyl phenyl silicone, polymers thereof, elastomers thereof, or any combination thereof.

The silicone material typically has a CTE of less than 150 ppm/° C. For example, the silicone material can have a CTE of about 30 ppm/° C., about 50 ppm/° C., or about 80 ppm/° C. to about 100 ppm/° C., about 120 ppm/° C., or about 145 ppm/° C. The silicone material can have a glass transition of less than −60° C. For example, the silicone material can have a glass transition of about −100° C. to about −150° C. The silicone material can have a Young's modulus of about 0.5 MPa to about 5 MPa. In some examples, the silicone material has a Young's modulus of less than 1 MPa, such as about 0.5 MPa, about 0.6 MPa, or about 0.7 MPa to about 0.8 MPa, about 0.9 MPa, or about 0.95 MPa.

The bonding layer 170 can have a thickness of about 0.1 mm to about 1.2 mm, such as about 0.3 mm to about 0.9 mm, about 0.4 mm to about 0.8 mm, or about 0.5 mm to about 0.7 mm.

In several examples, the bonding layer 170 contains one or more silicone materials under the tradename of NuSil® and commercially available from Avantor, Inc. Exemplary NuSil® silicones can be or include one or more of: NuSil® R3-2160 two-component adhesive/sealant containing a silicone elastomer and useful in applications at a temperature of about 0° C. to about −140° C.; NuSil® R-2655 and NuSil® R-2560 two-component silicones useful in applications at a temperature of about 0° C. to about −115° C.; NuSil® R-2949 thermally conductive two-component adhesive useful in applications at a temperature of about 0° C. to about −115° C.; and NuSil® R-2634 electrically conductive silicone adhesive useful in applications at a temperature of about 0° C. to about −140° C.

Figure 3:
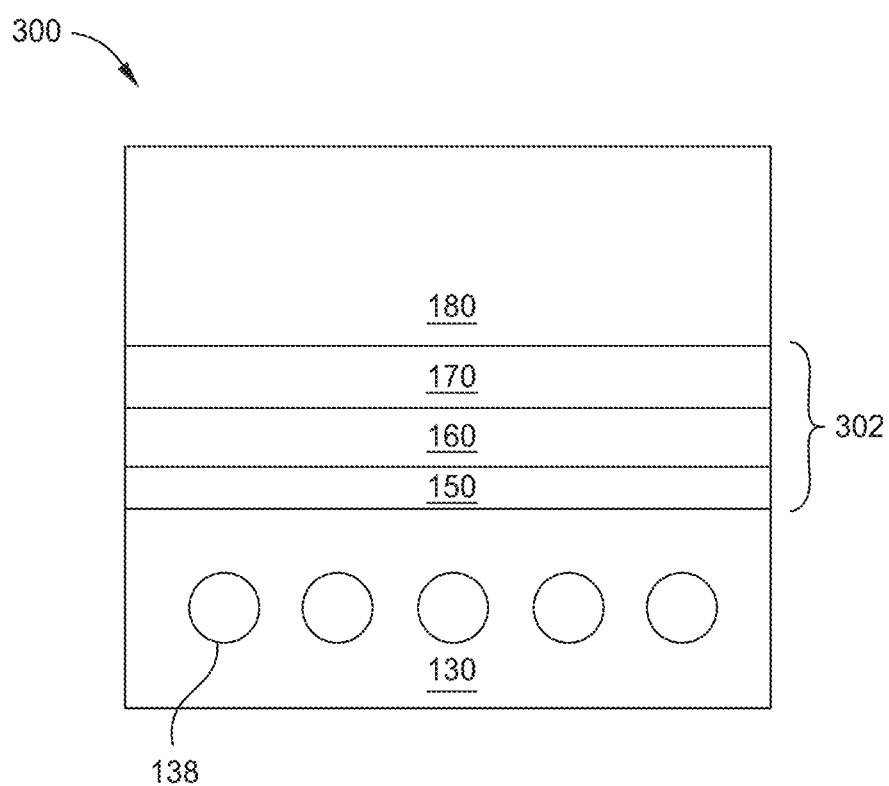
FIG. 3 depicts a cross-sectional schematic side view of another electrostatic chuck assembly, according to one or more embodiments described and discussed herein.

FIG. 3 depicts a cross-sectional schematic side view of another electrostatic chuck (ESC) assembly 300, according to one or more embodiments described and discussed herein. In one or more embodiments, the ESC assembly 300 includes the ESC 180, the cooling plate 130 containing an aluminum alloy, where the aluminum alloy contains aluminum and silicon and has a CTE of less than 22 ppm/° C. A bonding film 302 is disposed between the ESC 180 and the cooling plate 130. The bonding film 302 can include the bonding layer 170 which contains one or more silicone materials.

In some embodiments, the bonding film 302 further includes a secondary metal layer 160 disposed between the bonding layer 170 and the cooling plate 130. The secondary metal layer 160 contains a metal selected from molybdenum, tungsten, chromium, iron, nickel, titanium, zirconium, iron-nickel-cobalt alloys, alloys thereof, and any combination thereof. In one or more examples, an exemplary iron-nickel-cobalt alloy can be a KOVAR® alloy and have about 53.4 wt % of iron, about 29 wt % of nickel, about 17 wt % of cobalt, about 0.2% of silicon, about 0.3% of manganese, about <0.01% of carbon.

The secondary metal layer 160 contains metallic molybdenum, a molybdenum alloy, metallic tungsten, a tungsten alloy, metallic chromium, or a chromium alloy. The secondary metal layer 160 can have a thickness of about 3 mm to about 12 mm, such as about 5 mm to about 10 mm. The secondary metal layer 160 can have a CTE of less than 12 ppm/° C., such as about 3 ppm/° C. to about 8 ppm/° C.

In one or more embodiments, the bonding film 302 further contains an indium-containing layer 150 disposed between the secondary metal layer 160 and the cooling plate 130. The indium-containing layer 150 contains metallic indium or an indium alloy. The indium-containing layer has a thickness of about 100 μm to about 1,000 μm, such as about 200 μm to about 500 μm, about 250 μm to about 450 μm, or about 300 μm to about 400 μm.

In some embodiments, the ESC assembly 300 includes the ESC 180, the cooling plate 130 containing an aluminum alloy, wherein the aluminum alloy contains aluminum and silicon and has a CTE of less than 22 ppm/° C., and the bonding film 302 disposed between the ESC 180 and the cooling plate 130. In one or more examples, the bonding film 302 contains the bonding layer 170 containing one or more silicone materials, an indium-containing layer 150, and a secondary metal layer 160 disposed between the bonding layer 170 and the indium-containing layer 150. The secondary metal layer 160 can be or include molybdenum, tungsten, chromium, and alloys thereof.

Figure 4:
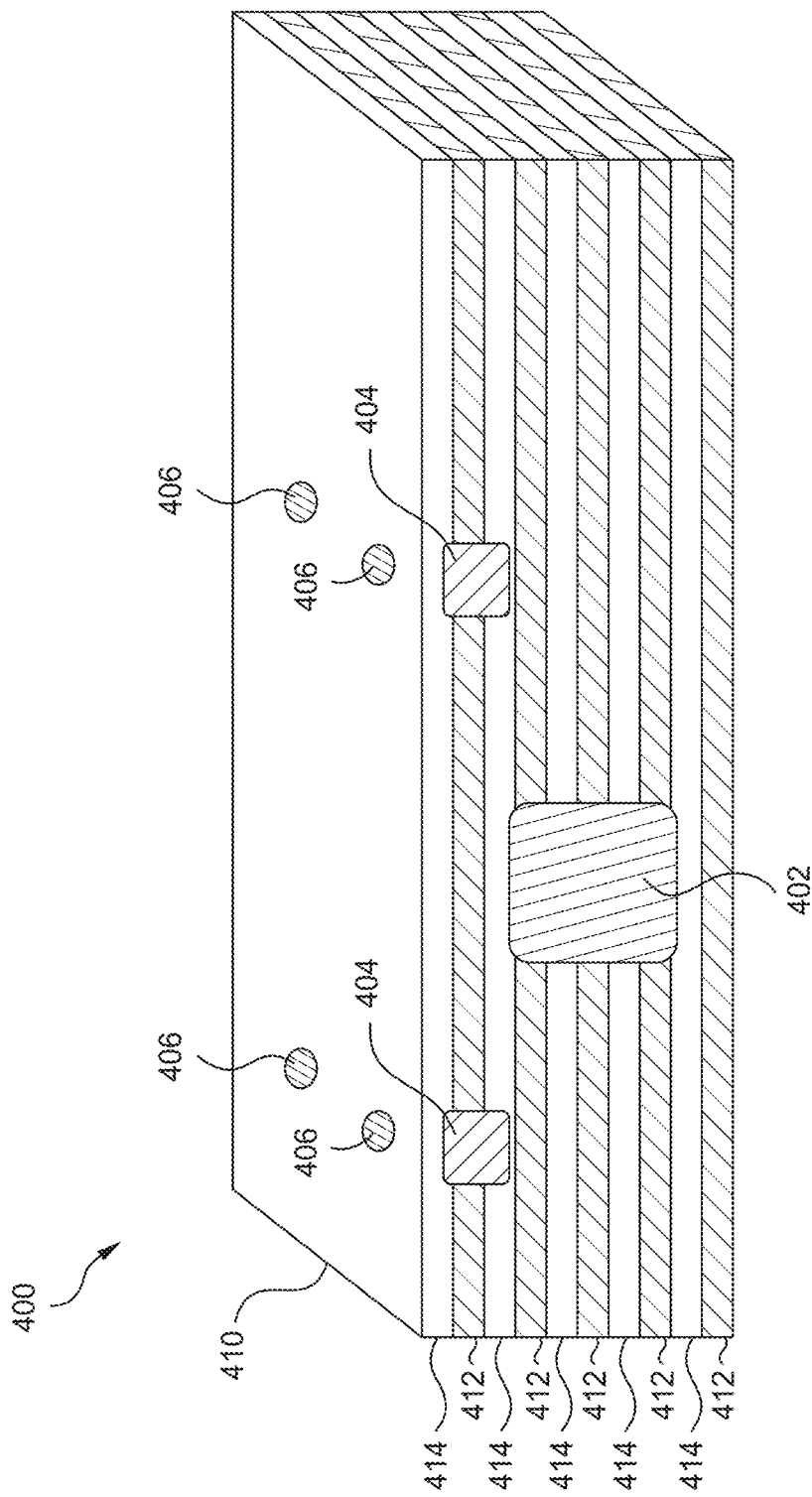
FIG. 4 depicts a cross-sectional schematic perspective view of a cooling plate, according to one or more embodiments described and discussed herein.

FIG. 4 depicts a cross-sectional schematic perspective view of a cooling plate 400, according to one or more embodiments described and discussed herein. In one or more embodiments, the cooling plate 130, depicted in FIGS. 1-3, can be used as replaced or otherwise substituted with the cooling plate 400, as described and discussed herein. In some embodiments, the cooling plate 400 has a body 410 which contains one, two, or more internal channels 402, one, two, or more channels 404, and one, two, or more passageways 406. Although the cooling plate 400 depicted in FIG. 4 illustrates one channel 402, two channels 404, and four passageways 406, the cooling plate 400 may contain different amounts of each of the channels 402, the channels 404, and the passageways 406. For example, although not shown, the cooling plate 400 can have 1-3 of the channels 402; 1-4 of the channels 404; and/or 1-100 of the passageways 406. In one or more configurations, each of the internal channels 402 is coupled to and in fluid communication with a cooling fluid or heat transfer fluid, each of the channels 404 is coupled to and in fluid communication with a process gas (e.g., helium, argon, neon, dinitrogen, or combinations thereof), and the passageways 406 are coupled to and in fluid communication to a respective channel 404.

The cooling plate 400 has a body 410 which contains a stack of inter sheets or layers which includes at least a first layer 412 and a second layer 414, where each of the first layer 412 and the second layer 414 independently contain a metal different from the other, and each metal has a different CTE. In one or more embodiments, the first layer 412 can be or include one or more metals selected from aluminum, aluminum alloy, copper, indium, magnesium, alloys thereof, and any combination thereof, and the second layer 414 can be or include one or more metals selected from molybdenum, tungsten, chromium, iron, nickel, titanium, zirconium, one or more iron-nickel-cobalt alloys (KOVAR® alloy, as described and discussed above), alloys thereof, and any combination thereof.

In other embodiments, the cooling plate 400 includes a stack of alternating layers containing a first layer 412 and a second layer 414, and wherein the first layer 412 contains the aluminum alloy and the second layer 414 contains molybdenum. In one or more examples, the aluminum alloy contains about 5 at % to about 40 at %, about 8 at % to about 20 at %, or about 10 at % to about 18 at % of silicon.

Although FIG. 4 depicts the cooling plate 400 with five of the first layers 412 and five of the second layers 414, the cooling plate 400 can have a variety of different amounts of each of the first layer 412 and the second layer 414. The cooling plate 400 can have from 1, 2, 3, 4, 5, 8, 10, 15, 18, 19, or 20 layers to 22, about 25, about 30, about 50, about 80, or about 100 layers for each of the first layer 412 and the second layer 414. For example, the cooling plate 400 can have a stack (of the first layer 412 and the second layer 414) which contains about 5 first layers 412 to about 50 first layers 412 and about 5 second layers 414 to about 50 second layers 414. In other examples, the stack contains about 12 first layers 412 to about 30 first layers 412 and about 12 second layers 414 to about 30 second layers 414.

The first layer 412 can have a thickness of about 0.1 mm to about 1 mm, such as about 0.2 mm to about 0.5 mm. The second layer 414 can have a thickness of about 0.5 mm to about 2.5 mm, such as about 0.8 mm to about 1.2 mm. The stack (of the first layer 412 and the second layer 414) and/or the cooling plate 400 can have a thickness of about 8 mm to about 35 mm, such as about 15 mm to about 25 mm. In some examples, the first layers 412 and the second layers 414 are joined or otherwise bonded together with heat in a furnace or by heat and application of pressure to join or bond them hermetically tight at the interfaces.

Embodiments of the present disclosure further relate by way of example and not by way of limitation to any one or more of the following examples 1-46.

Example 1. An electrostatic chuck assembly, comprising: an electrostatic chuck having a workpiece supporting surface opposite a bottom surface; a cooling plate having a top surface, wherein the cooling plate comprises an aluminum alloy having a coefficient of thermal expansion (CTE) of less than 22 parts per million/° C. (ppm/° C.); and a bonding layer securing the bottom surface of the electrostatic chuck and the top surface of the cooling plate, wherein the bonding layer comprises a silicone material.

Example 2. An electrostatic chuck assembly, comprising: an electrostatic chuck having a workpiece supporting surface opposite a bottom surface; a cooling plate comprising an aluminum alloy, wherein the aluminum alloy comprises aluminum and silicon and has a CTE of less than 22 ppm/° C.; and a bonding film disposed between the electrostatic chuck and the cooling plate, wherein the bonding film comprises a bonding layer comprising a silicone material.

Example 3. An electrostatic chuck assembly, comprising: an electrostatic chuck having a workpiece supporting surface opposite a bottom surface; a cooling plate comprising an aluminum alloy, wherein the aluminum alloy comprises aluminum and silicon and has a CTE of less than 22 ppm/° C.; and a bonding film disposed between the electrostatic chuck and the cooling plate, wherein the bonding film comprises: a bonding layer comprising a silicone material; an indium-containing layer; and a secondary metal layer disposed between the bonding layer and the indium-containing layer, wherein the secondary metal layer comprises molybdenum, tungsten, chromium, and alloys thereof.

Example 4. The electrostatic chuck assembly according to any one of examples 1-3, wherein the aluminum alloy comprises about 80 atomic percent (at %) to about 90 at % of aluminum and about 5 at % to about 20 at % of silicon.

Example 5. The electrostatic chuck assembly according to any one of examples 1-4, wherein the aluminum alloy comprises aluminum, silicon, and at least one metal selected from the group consisting of molybdenum, tungsten, chromium, and alloys thereof.

Example 6. The electrostatic chuck assembly according to any one of examples 1-5, wherein the aluminum alloy comprises about 30 at % to about 60 at % of aluminum, about 30 at % to about 60 at % of molybdenum, and about 5 at % to about 30 at % of silicon.

Example 7. The electrostatic chuck assembly according to any one of examples 1-6, wherein the aluminum alloy has a coefficient of thermal expansion of less than 20 ppm/° C.

Example 8. The electrostatic chuck assembly according to any one of examples 1-7, wherein the aluminum alloy has a CTE of less than 18 ppm/° C.

Example 9. The electrostatic chuck assembly according to any one of examples 1-8, wherein the aluminum alloy has a CTE of about 4 ppm/° C. to about 16 ppm/° C.

Example 10. The electrostatic chuck assembly according to any one of examples 1-9, wherein the cooling plate has a thickness of about 0.1 inches to about 2 inches.

Example 11. The electrostatic chuck assembly according to any one of examples 1-10, wherein the cooling plate has a thickness of about 0.25 inches to about 1 inch.

Example 12. The electrostatic chuck assembly according to any one of examples 1-11, wherein the cooling plate comprises a stack of inter sheets or layers comprising at least a first layer and a second layer, wherein each of the first layer and the second layer independently contain a metal different from the other, and each metal has a different CTE.

Example 13. The electrostatic chuck assembly according to any one of examples 1-12, wherein the first layer comprises one or more metals selected from the group consisting of copper, indium, magnesium, alloys thereof, and any combination thereof, and wherein the second layer comprises one or more metals selected from the group consisting of molybdenum, tungsten, chromium, iron, nickel, titanium, zirconium, iron-nickel-cobalt alloys, alloys thereof, and any combination thereof.

Example 14. The electrostatic chuck assembly according to any one of examples 1-13, wherein the cooling plate comprises a stack of alternating layers comprising a first layer and a second layer, and wherein the first layer comprises the aluminum alloy and the second layer comprises molybdenum.

Example 15. The electrostatic chuck assembly according to any one of examples 1-14, wherein the aluminum alloy comprises about 5 at % to about 40 at % of silicon.

Example 16. The electrostatic chuck assembly according to any one of examples 1-15, wherein the aluminum alloy comprises about 8 at % to about 20 at % of silicon.

Example 17. The electrostatic chuck assembly according to any one of examples 1-16, wherein the stack comprises about 5 first layers to about 50 first layers and about 5 second layers to about 50 second layers.

Example 18. The electrostatic chuck assembly according to any one of examples 1-17, wherein the stack comprises about 12 first layers to about 30 first layers and about 12 second layers to about 30 second layers.

Example 19. The electrostatic chuck assembly according to any one of examples 1-18, wherein the first layer has a thickness of about 0.1 mm to about 1 mm.

Example 20. The electrostatic chuck assembly according to any one of examples 1-19, wherein the first layer has a thickness of about 0.2 mm to about 0.5 mm.

Example 21. The electrostatic chuck assembly according to any one of examples 1-20, wherein the second layer has a thickness of about 0.5 mm to about 2.5 mm.

Example 22. The electrostatic chuck assembly according to any one of examples 1-21, wherein the second layer has a thickness of about 0.8 mm to about 1.2 mm.

Example 23. The electrostatic chuck assembly according to any one of examples 1-22, wherein the stack has a thickness of about 8 mm to about 35 mm.

Example 24. The electrostatic chuck assembly according to any one of examples 1-23, wherein the cooling plate comprises a plurality of channels formed therein.

Example 25. The electrostatic chuck assembly according to any one of examples 1-24, wherein the bonding layer has a thickness of about 0.1 mm to about 1.2 mm.

Example 26. The electrostatic chuck assembly according to any one of examples 1-25, wherein the bonding layer has a thickness of about 0.3 mm to about 0.9 mm.

Example 27. The electrostatic chuck assembly according to any one of examples 1-26, wherein the silicone material of the bonding layer comprises alkyl phenyl silicone.

Example 28. The electrostatic chuck assembly according to any one of examples 1-27, wherein the silicone material has a CTE of less than 150 ppm/° C.

Example 29. The electrostatic chuck assembly according to any one of examples 1-28, wherein the silicone material has a glass transition of less than −60° C.

Example 30. The electrostatic chuck assembly according to any one of examples 1-29, wherein the silicone material has a glass transition of about −100° C. to about −150° C.

Example 31. The electrostatic chuck assembly according to any one of examples 1-30, wherein the silicone material has a Young's modulus of about 0.5 MPa to about 5 MPa.

Example 32. The electrostatic chuck assembly according to any one of examples 1-31, wherein the silicone material has a Young's modulus of less than 1 MPa.

Example 33. The electrostatic chuck assembly according to any one of examples 1-32, wherein the electrostatic chuck comprises alumina, aluminum nitride, or dopants thereof.

Example 34. The electrostatic chuck assembly according to any one of examples 1-33, wherein the electrostatic chuck comprises a material having a CTE of less than 15 ppm/° C.

Example 35. The electrostatic chuck assembly according to any one of examples 1-34, wherein the electrostatic chuck comprises a material having a CTE of about 5 ppm/° C. to about 10 ppm/° C.

Example 36. The electrostatic chuck assembly according to any one of examples 1-35, wherein the electrostatic chuck comprises about 50 heaters to about 200 heaters disposed therein, and wherein each heater is independently enabled to control temperature in a respective zone.

Example 37. The electrostatic chuck assembly according to any one of examples 1-36, wherein the bonding film further comprises a secondary metal layer disposed between the bonding film and the cooling plate, and wherein the secondary metal layer comprises a metal selected from the group consisting of molybdenum, tungsten, chromium, iron, nickel, titanium, zirconium, iron-nickel-cobalt alloys, alloys thereof, and any combination thereof.

Example 38. The electrostatic chuck assembly according to any one of examples 1-37, wherein the secondary metal layer comprises metallic molybdenum, a molybdenum alloy, metallic tungsten, a tungsten alloy, metallic chromium, or a chromium alloy.

Example 39. The electrostatic chuck assembly according to any one of examples 1-38, wherein the secondary metal layer has a thickness of about 3 mm to about 12 mm.

Example 40. The electrostatic chuck assembly according to any one of examples 1-39, wherein the secondary metal layer has a thickness of about 5 mm to about 10 mm.

Example 41. The electrostatic chuck assembly according to any one of examples 1-40, wherein the secondary metal layer has a CTE of less than 12 ppm/° C.

Example 42. The electrostatic chuck assembly according to any one of examples 1-41, wherein the secondary metal layer has a CTE of about 3 ppm/° C. to about 8 ppm/° C.

Example 43. The electrostatic chuck assembly according to any one of examples 1-42, wherein the bonding film further comprises an indium-containing layer disposed between the secondary metal layer and the cooling plate.

Example 44. The electrostatic chuck assembly according to any one of examples 1-43, wherein the indium-containing layer comprises metallic indium or an indium alloy.

Example 45. The electrostatic chuck assembly according to any one of examples 1-44, wherein the indium-containing layer has a thickness of about 100 µm to about 1,000 µm.

Example 46. The electrostatic chuck assembly according to any one of examples 1-45, wherein the indium-containing layer has a thickness of about 200 µm to about 500 µm.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. An electrostatic chuck assembly, comprising:
 an electrostatic chuck having a workpiece supporting surface opposite a bottom surface;
 a cooling plate having a top surface, the cooling plate further comprising:
  a stack of alternating layers comprising a first layer and a second layer, wherein the first layer comprises an aluminum alloy having a coefficient of thermal expansion (CTE) of less than 22 parts per million/° C. (ppm/° C.) and wherein the second layer comprises one or more metals selected from the group consisting of molybdenum, tungsten, chromium, iron, nickel, zirconium, iron-nickel-cobalt alloys, alloys thereof, and any combination thereof; and
 a bonding layer securing the bottom surface of the electrostatic chuck and the top surface of the cooling plate.

2. The electrostatic chuck assembly of claim 1, wherein the aluminum alloy comprises about 80 atomic percent (at %) to about 90 at % of aluminum and about 5 at % to about 20 at % of silicon.

3. The electrostatic chuck assembly of claim 1, wherein the aluminum alloy comprises aluminum, silicon, and at least one metal selected from the group consisting of molybdenum, tungsten, chromium, and alloys thereof.

4. The electrostatic chuck assembly of claim 1, wherein the aluminum alloy comprises about 30 at % to about 60 at % of aluminum, about 30 at % to about 60 at % of molybdenum, and about 5 at % to about 30 at % of silicon.

5. The electrostatic chuck assembly of claim 1, wherein the aluminum alloy has a coefficient of thermal expansion of less than 20 ppm/° C.

6. The electrostatic chuck assembly of claim 1, wherein each of the first layer and the second layer independently contain a metal different from the other, and each metal has a different CTE.

7. The electrostatic chuck assembly of claim 6, wherein the first layer comprises one or more metals selected from the group consisting of copper, indium, magnesium, alloys thereof, and any combination thereof.

8. The electrostatic chuck assembly of claim 1, wherein the aluminum alloy comprises about 5 at % to about 40 at % of silicon.

9. The electrostatic chuck assembly of claim 1, wherein the stack comprises about 5 first layers to about 50 first layers and about 5 second layers to about 50 second layers.

10. The electrostatic chuck assembly of claim 1, wherein the first layer has a thickness of about 0.1 mm to about 1 mm, and wherein the second layer has a thickness of about 0.5 mm to about 2.5 mm.

11. The electrostatic chuck assembly of claim 1, wherein the bonding layer comprises a silicone material.

12. The electrostatic chuck assembly of claim 11, wherein the silicone material has a CTE of less than 150 ppm/° C., a glass transition of less than −60° C., and a Young's modulus of less than 1 MPa.

13. The electrostatic chuck assembly of claim 1, wherein the electrostatic chuck comprises about 50 heaters to about 200 heaters disposed therein, and wherein each heater is independently enabled to control temperature in a respective zone.

14. An electrostatic chuck assembly, comprising:
an electrostatic chuck having a workpiece supporting surface opposite a bottom surface;
a cooling plate comprising a stack of alternating layers comprising a first layer and a second layer, and wherein the first layer comprises an aluminum alloy and the second layer comprises a metal different than the aluminum alloy selected from the group consisting of molybdenum, tungsten, chromium, iron, nickel, zirconium, iron-nickel-cobalt alloys, alloys thereof, and any combination thereof, and wherein the aluminum alloy comprises aluminum and silicon and has a coefficient of thermal expansion (CTE) of less than 22 parts per million/° C. (ppm/° C.); and
a bonding film disposed between the electrostatic chuck and the cooling plate.

15. The electrostatic chuck assembly of claim 14, wherein the bonding film comprises a bonding layer.

16. The electrostatic chuck assembly of claim 15, wherein the bonding layer comprises a silicone material.

17. The electrostatic chuck assembly of claim 15, wherein the bonding film further comprises a secondary metal layer disposed between the bonding layer and the cooling plate, and wherein the secondary metal layer comprises a metal selected from the group consisting of molybdenum, tungsten, chromium, iron, nickel, titanium, zirconium, iron-nickel-cobalt alloys, alloys thereof, and any combination thereof.

18. The electrostatic chuck assembly of claim 17, wherein the secondary metal layer comprises metallic molybdenum, a molybdenum alloy, metallic tungsten, a tungsten alloy, metallic chromium, or a chromium alloy.

19. The electrostatic chuck assembly of claim 17, wherein the secondary metal layer has a thickness of about 3 mm to about 12 mm and a CTE of less than 12 ppm/° C.

20. The electrostatic chuck assembly of claim 17, wherein the bonding film further comprises an indium-containing layer disposed between the secondary metal layer and the cooling plate.

21. The electrostatic chuck assembly of claim 20, wherein the indium-containing layer comprises metallic indium or an indium alloy and has a thickness of about 100 μm to about 1,000 μm.

22. An electrostatic chuck assembly, comprising:
an electrostatic chuck having a workpiece supporting surface opposite a bottom surface;
a cooling plate comprising a stack of alternating layers comprising a first layer and a second layer, wherein the first layer comprises an aluminum alloy and the second layer comprises a metal different than the aluminum alloy selected from the group consisting of molybdenum, tungsten, chromium, iron, nickel, zirconium, iron-nickel-cobalt alloys, alloys thereof, and any combination thereof, and wherein the aluminum alloy comprises aluminum and silicon and has a coefficient of thermal expansion (CTE) of less than 22 parts per million/° C. (ppm/° C.); and
a bonding film disposed between the electrostatic chuck and the cooling plate, wherein the bonding film comprises a secondary metal layer disposed between a bonding layer and an indium-containing layer.

23. An electrostatic chuck assembly, comprising:
an electrostatic chuck having a workpiece supporting surface opposite a bottom surface;
a cooling plate having a top surface, the cooling plate further comprising:
a stack of alternating layers comprising a first layer and a second layer, wherein the first layer comprises an aluminum alloy having a coefficient of thermal expansion (CTE) of less than 22 parts per million/° C. (ppm/° C.) and wherein the second layer comprises molybdenum; and
a bonding layer securing the bottom surface of the electrostatic chuck and the top surface of the cooling plate.

* * * * *